United States Patent [19]

Stephens et al.

[11] Patent Number: 5,297,016
[45] Date of Patent: Mar. 22, 1994

[54] POLYPHASE EMULATOR FOR SINGLE PHASE CIRCUIT

[75] Inventors: George H. Stephens, Duluth; R. Wendell Goodwin, Dunwoody, both of Ga.

[73] Assignee: Schlumberger Industries, Inc., Norcross, Ga.

[21] Appl. No.: 68,490

[22] Filed: May 27, 1993

[51] Int. Cl.⁵ ............................................. H02M 5/00
[52] U.S. Cl. ........................ 363/149; 363/148; 328/24
[58] Field of Search ............... 363/148, 149, 156; 331/45; 328/24; 315/138, 140

[56] References Cited

U.S. PATENT DOCUMENTS

| | | | |
|---|---|---|---|
| 2,673,954 | 10/1949 | Smith | 363/149 |
| 3,267,358 | 8/1966 | Anderson | 363/149 |
| 4,322,790 | 3/1982 | Wolfinger | 328/24 |
| 4,618,809 | 10/1986 | Maeda | 363/148 |
| 4,887,018 | 12/1989 | Libert | 363/149 |
| 4,908,744 | 3/1990 | Hollinger | 363/148 |
| 5,133,014 | 7/1992 | Pritchard | 381/61 |

*Primary Examiner*—Steven L. Stephan
*Assistant Examiner*—Matthew Nguyen
*Attorney, Agent, or Firm*—Sanford J. Asman

[57] ABSTRACT

An emulator which is able to operate on a standard single phase 120 VAC line, generates simulated three-phase alternating current in order to demonstrate the operation of a polyphase electricity meter. The emulator is also capable of demonstrating the operation of the polyphase electricity meter which has been incorrectly wired into the polyphase circuit, i.e., with incorrect or missing connections to the current transformers; or in which there are problems with the phasing of the polyphase circuit, i.e., incorrect phase differences between circuits or between the currents and voltages within any of the phases.

4 Claims, 7 Drawing Sheets

POLYPHASE EMULATOR FOR SINGLE PHASE CIRCUIT

BACKGROUND OF THE INVENTION

This invention relates generally to a electronic circuit which can be used on a single phase alternating current circuit to emulate a polyphase alternating current circuit. The purpose of the present invention is to provide a simple method of demonstrating or testing electricity meters of the type which are intended for use in metering polyphase alternating current supplies.

Electricity meters are used to measure electricity use and demand. Typically, such meters are sold to electric utilities who use them to record electricity consumption and demand for billing and other purposes.

Electricity is typically generated and distributed as a three phase alternating current. However, many users only receive single phase service. Consequently, the typical residential electricity meter is a single phase electromechanical meter, and standard electricity outlets in the United States supply single phase 60 Hz, 120 volt alternating current (VAC).

Many commercial and industrial users require three-phase service. Consequently, their electricity is metered using so-called "polyphase" meters, of the type supplied by Schlumberger Industries, Inc., Norcross, Ga., the assignee of the present invention. An electronic, polyphase meter which was recently introduced by Schlumberger Industries, Inc., called the VECTRON TM electronic polyphase meter includes a feature, called SITESCAN TM which was implemented in firmware within the VECTRON TM meter. The SITESCAN TM feature enables the VECTRON TM meter to effectively determine whether there has been a problem in the installation or wiring to the VECTRON TM meter. Such problems can easily result, because metering of polyphase circuits involves the vector relationships between the voltage and current on the three phases supplied to the customer. Thus, if there is any incorrect wiring to any of the current transformers or voltage transformers in any of the three phases supplied, the meter cannot properly do its job. The purpose of the SITESCAN TM feature is to identify such problems at the time the VECTRON TM meter is installed. Yet another purpose of the SITESCAN TM feature is to identify any tampering which may have taken place following the installation of a VECTRON TM meter.

The foregoing features of the VECTRON TM meter, and of the SITESCAN TM feature may be demonstrated to meter personnel learning to use the features of the VECTRON TM meter and others, including potential customers for the VECTRON TM meter only when the VECTRON TM meter is connected to a three phase system. As such connections are not typically readily available, and as single phase 120 VAC power can be found virtually any place, it would be desirable to have a polyphase emulator available which works off a single phase alternating current circuit. Such an emulator could be simply plugged into virtually any wall socket which provides 120 VAC, and then plugged into the VECTRON TM meter to demonstrate the operation of the VECTRON TM meter, including the SITESCAN TM feature. Naturally, with suitable modifications, an emulator of the type described could also be used to demonstrate the operation of polyphase meters, other than the VECTRON TM meter.

SUMMARY OF THE INVENTION

The present invention is a polyphase emulator for use in demonstrating the functionality of a polyphase electricity meter and which operates on a single phase electricity circuit. The emulator comprises a phase generating circuit which generates multiple sets of currents and voltages, which are representative of the different phases being emulated. Each of these sets has a nominal predetermined phase relationship, i.e., typically 120 degrees, with respect to each of the other sets. The phase generating circuits include means for altering the nominal predetermined phase relationships between the sets of currents and voltages.

In addition to the phase generating circuit, which generates the various emulated phases, referred to herein as Phase A, Phase B, and Phase C, there is also a phase specific circuit for each of the phases. Each of the phase specific circuits includes means for emulating specific parameters relating to the voltage and current within each of the sets. The phase specific circuits can also be used to cross-phase connections between phases.

BEST MODE FOR PRACTICING THE INVENTION

Figure 1:
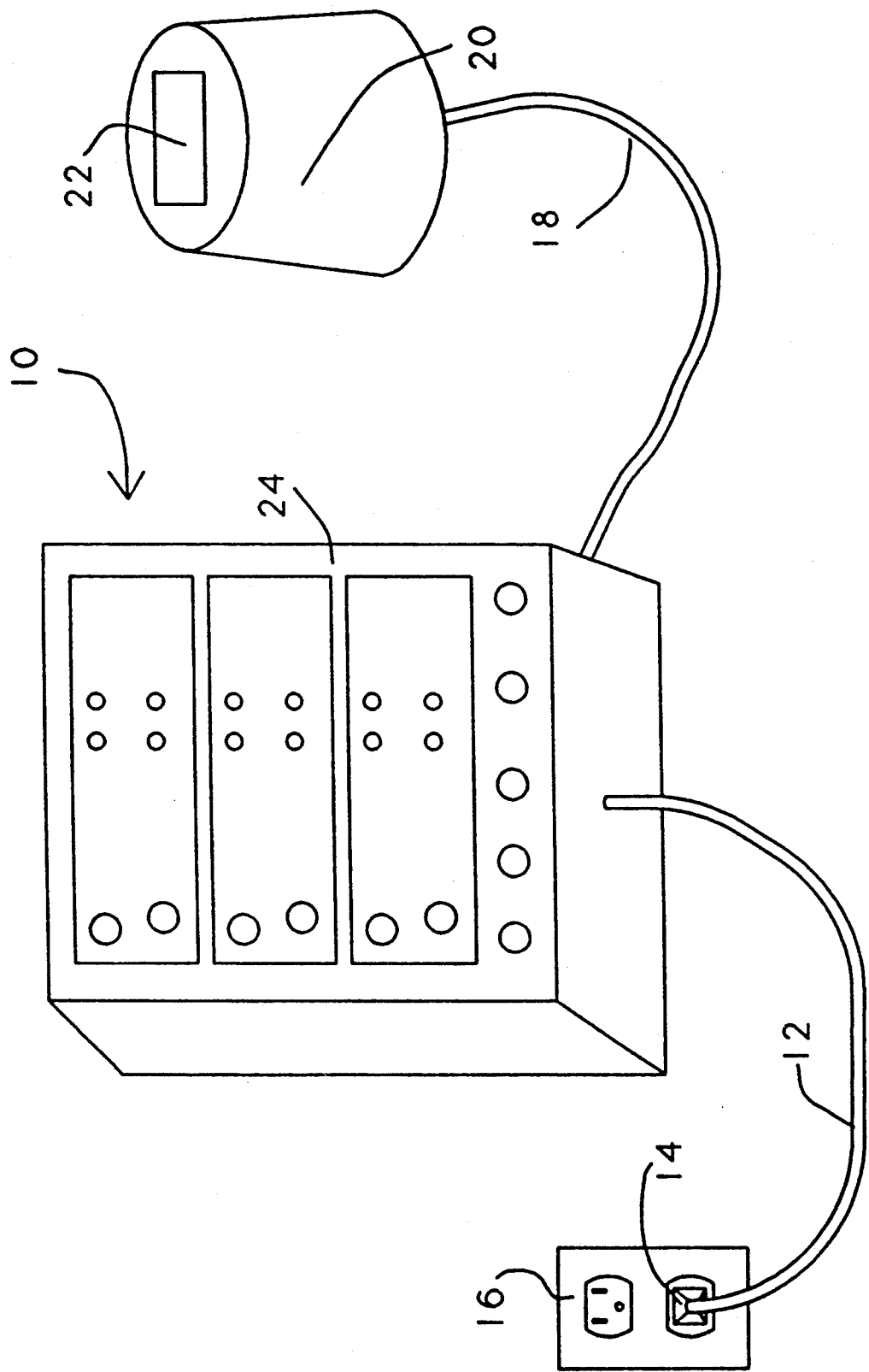
FIG. 1 is a view of the emulator of the present invention, connected to a single phase 120 VAC line and to a polyphase meter, illustrating the use of the present invention.

Referring to FIG. 1, the emulator 10 of the present invention is shown to include an AC cord 12 terminating at a standard AC plug 14 which is plugged into a standard single phase 120 VAC wall socket 16 The emulator 10 includes an output cable 18 which is shown to be connected to a polyphase electronic meter 20, such as the VECTRON TM meter manufactured by Schlumberger Industries, Inc., Norcross, Ga. The meter 20 includes a display 22, which in the case of the foregoing VECTRON TM meter may be a liquid crystal display (LCD) which is used to display either metering information or information relating to the manner in which the meter 20 has been installed, i.e., information produced by the SITESCAN ™ feature of the meter 20 which provides the user with information regarding the installation of the meter 20. In particular, in the case of the VECTRON ™ meter with the SITESCAN ™ feature, the display 22 will illustrate whether there are phase angle problems between the phases of the polyphase circuit, or, alternatively, whether voltage and current are being monitored on each of the three phases.

Figure 2:
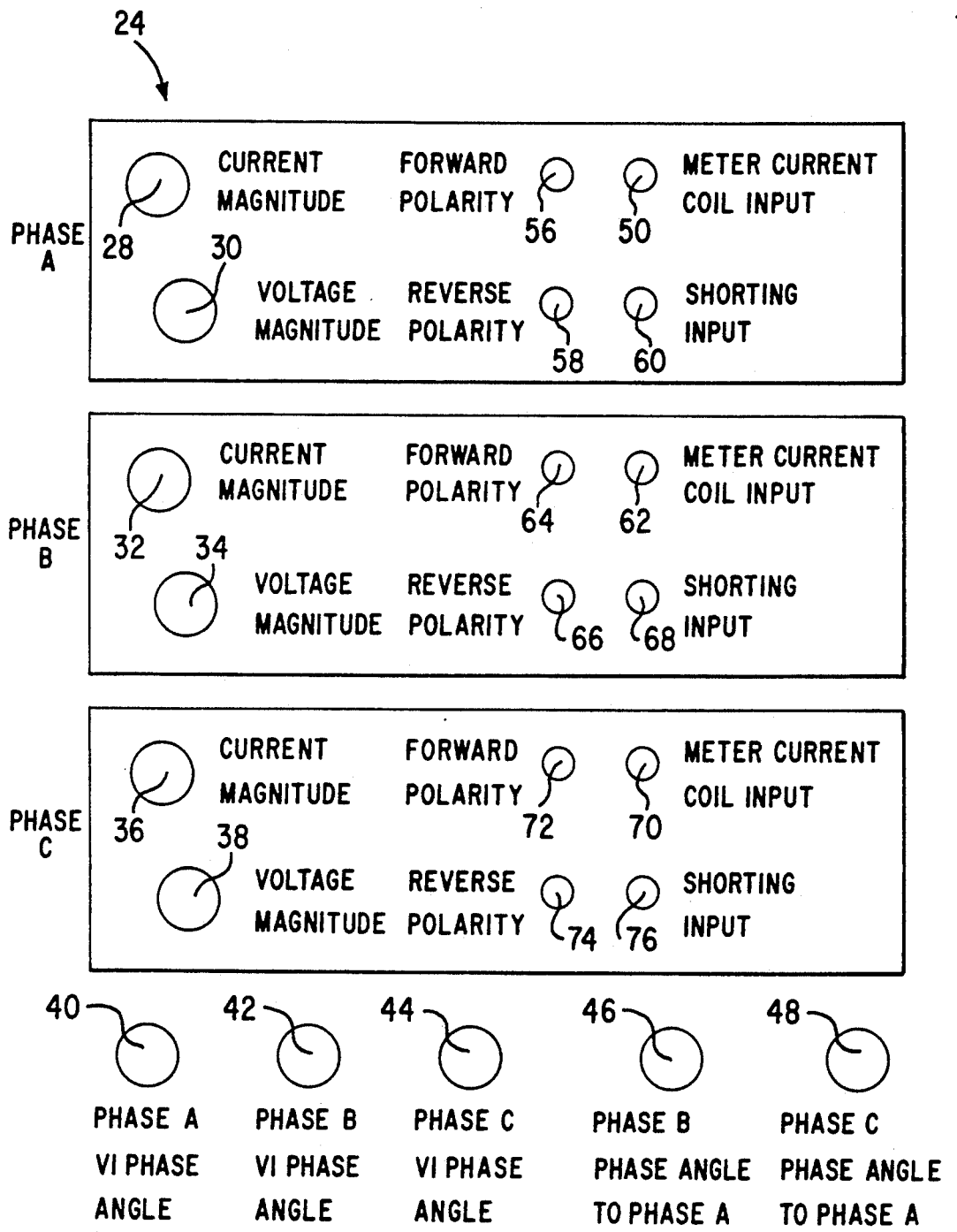
FIG. 2 is close-up view of a the controls used on the emulator of the present invention.

Referring to FIG. 2, a close-up view of the control panel 24 of the emulator 10 is shown. As illustrated, the control panel 24 includes a number of knobs 28, 30, 32, 34, 36, 38, 40, 42, 44, 46 and 48, which are used to adjust various current and voltage parameters which the emulator supplies to the meter 20, as will be explained below. The control panel 24 further comprises a number of banana jacks 50, 62 and 70 into which jumper wires (not shown) are plugged to alter the apparent hook-up of the emulated current transformers to emulate different correct and incorrect hook-ups which would affect the meter 20. In particular, the three phases are referred to herein as phases A, B, and C. The knobs 28, 30 are used to control the current and voltage magnitudes, respectively, of phase A; the knobs 32, 34 are used to control the current and voltage magnitudes, respectively, of phase B; and the knobs 36, 38 are used to control the current and voltage magnitudes, respectively, of phase C. The knobs 40, 42, 44 are used to control the phase relationships between the voltages (V) and currents (I) on the three phases, A, B, C, respectively, and the knobs 46, 48 are used to control the phase angle relationships between phase A and B, and between phase A and C, respectively.

The jumper wires which are plugged into jacks 50, 62 and 70 are used to alter the appearance to the meter 20 of the emulated current transformers which the emulator 10 supplies to the meter 20. Thus, the jumper wire connected to jack 50 is terminated by a banana plug which may be plugged into banana jack 56 to emulate a proper current transformer hook-up (forward polarity) on phase A; or into banana jack 58 to emulate a reversed polarity current transformer hook-up on phase A; or into banana jack 60 to emulate a shorted current transformer on phase A. Similarly, the jumper wire connected to jack 62 is terminated by a banana plug which may be plugged into banana jack 64 to emulate a proper current transformer hook-up on phase B; or into banana jack 66 to emulate a reversed polarity current transformer hook-up on phase B; or into banana jack 68 to emulate a shorted current transformer on phase B. Finally, the jumper wire which is connected to jack 70 is terminated by a banana plug which may be plugged into banana jack 72 to emulate a proper current transformer hook-up on phase C; or into banana jack 74 to emulate a reversed polarity current transformer hook-up on phase C; or into banana jack 76 to emulate a shorted current transformer on phase C.

In addition to the various possible interconnections (both correct and incorrect) mentioned above, which relate to emulating current transformers within a specific phase, it is also possible to use the emulator 10 to emulate "cross-phasing" current transformers in a variety of ways. By way of example, the jumper connected to jack 50 (Phase A) could be plugged into jack 74 (Phase C). Consequently, while the term "phase specific circuit" is used herein, phase-crossing can also be emulated. Consequently, it will be obvious to those skilled in the art that the user of the emulator 10 will be able to exercise the meter 20 in a variety of ways.

Figure 3:
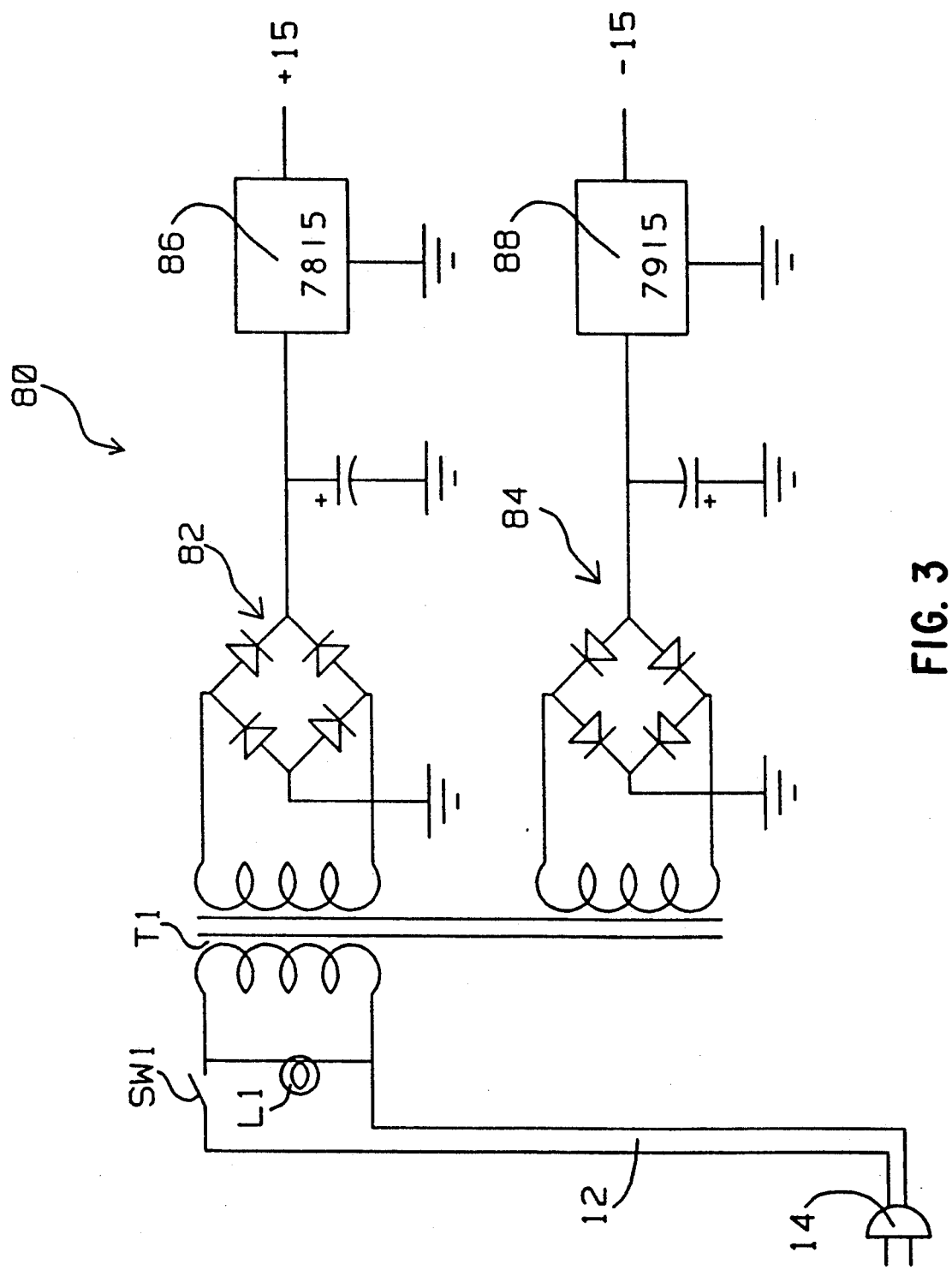
FIG. 3 is a schematic diagram of the power supply used in the present invention.

Referring now to FIG. 3, a schematic diagram of the power supply 80 used in the emulator 10 of the present invention is shown. In particular, the power supply 80 is comprised of a transformer, T1, which includes a primary coil connected through AC cord 12 to plug 14, as shown in FIG. 1 There is also a power switch SW1, which controls power to the emulator 10. In the preferred embodiment of the invention, when power is turned on, a Power On light, L1, indicates that the emulator 10 has power connected to it.

Transformer T1 has two secondary coils which provide about 18 VAC to a pair of standard diode rectifier circuits 82, 84. In the preferred embodiment of the invention, the diodes in the rectifier circuits 82, 84 are comprised of IN5810 diodes. The outputs of the rectifier circuits 82, 84 are used as inputs to voltage regulators, 86, 88, which are comprised of 7815 and 7915 voltage regulator integrated circuits which supply regulated output voltages of +15 volts DC and −15 volts DC, respectively, as shown. These voltages are used to power the various other integrated circuits in the emulator 10. As standard integrated circuits are used throughout the preferred embodiment of the invention, those skilled in the art will recognize that the outputs of the regulators 86, 88 are connected to the voltage supply pins of the other integrated circuits in a standard manner, which is not further explained below.

Figure 4:
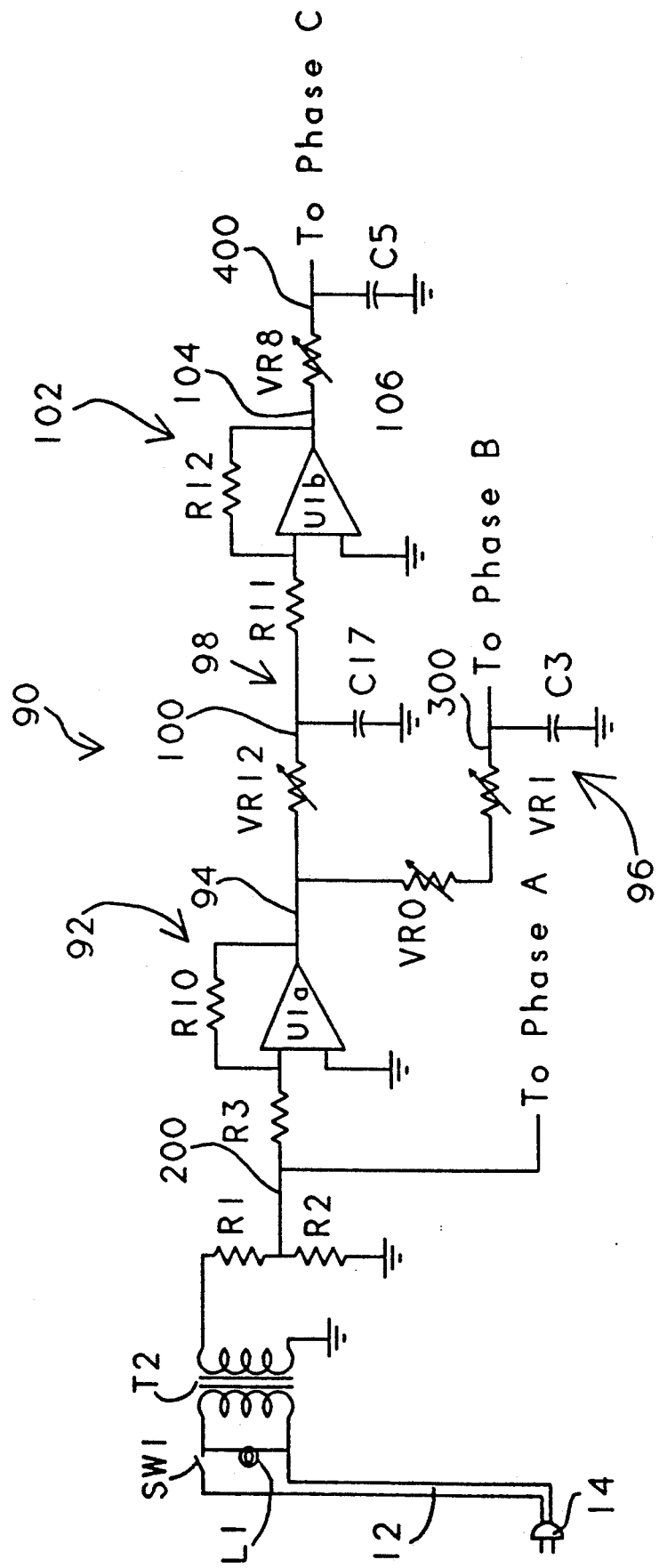
FIG. 4 is a schematic diagram illustrating the circuit used to generate three phase alternating current from a single phase alternating current supply.

Referring now to FIG. 4, a schematic diagram illustrating a phasse generating circuit 90 used to generate multiple sets of currents and voltages, is shown. Within each of the sets, referred to herein as Phases A, B and C, there is a nominal predetermined phase relationship between the current and voltage in that set and the current and voltage in the other sets. As will be shown, the phase generating circuit 90 includes means for altering the nominal predetermined relationship (nominally 120 degrees from Phase A to Phase B, and 120 degrees from Phase B to Phase C). The circuit 90 is comprised of a transformer T2, whose primary coil is connected in parallel to the primary coil of transformer T1 shown in FIG. 3, i.e., through AC cord 12 to plug 14, thereby powering the circuit 90 whenever power switch SW1 is turned on.

A voltage divider network comprised of 330K resistor R1 and 62K resistor R2 brings the voltage at the junction of R1 and R2, i.e., at reference point 200, to approximately 3 VAC. The voltage at reference point 200 is input into phase shifter 92, which is comprised of operational amplifier U1a, 150K resistor R3, and 300K resistor R10. The output of phase shifter 92 is a voltage on line 94 which has a level of approximately 6 VAC. The voltage on line 94 is 180 degrees out of phase from the voltage at reference point 200. As will be explained, the voltage at reference point 200 will be the input to the Phase A circuit shown schematically in FIG. 5a.

With continued reference now to FIG. 4, a pair of phase shifters 96, 98 are used to introduce phase shifts having nominal values of 60 degrees each to provide voltages at reference points 100, 300 which are nominally 120 degrees out of phase from the voltage at reference point 200. The phase angle of phase shifter 96 can be varied from the 60 degree nominal value by altering the value of either of the variable resistors VR0, VR1 which are part of phase shifter 96. In the preferred embodiment of the invention, capacitor C3 has a value of 4.7 microfarads, and variable resistor VR0 (0–500 ohms) is an internal adjustment which is set when the emulator 10 is manufactured. Its value is adjusted to provide a 120 degree phase shift between the voltages at reference points 200, 300 when the value of variable resistor VR1 (0–1K) is set to its maximum value (1K). As will be obvious to those skilled in the art, VR0 can be replaced by a fixed resistor once the proper value has been determined. The knob 46 is connected to the shaft of the potentiometer which comprises VR1. As will be explained, the voltage at reference point 300 will be the input to the Phase B circuit shown schematically in FIG. 5b.

The 60 degree phase shifter 98, comprised of internal variable resistor VR12 (0–1K) and capacitor C17 (15 microfarads) is adjusted to provide a voltage at reference point 100 which is 120 degrees out of phase from the voltage at reference point 200. The voltage at reference point 100 is input into 180 degree phase shifter 102, which is comprised of operational amplifier U1b, resistor R11 (150K), and resistor R12 (510K). The output of phase shifter 102 is a voltage on line 104 which has a level of approximately 6 VAC and which is 180 degrees out of phase from the voltage at reference point 100. Consequently, the voltage on line 104 is 300 degrees out of phase from the voltage at reference point 200. Using the phase shifter 106, comprised of variable resistor VR8 (0–1K) and capacitor C5 (6.8 microfarads), 60 degrees of phase shift is introduced, such that the voltage at reference point 400 is 240 degrees out of phase from the voltage at reference point 200. The knob 48 is connected to the shaft of the variable resistor VR8, and it can be turned to alter the phase of the voltage at reference point 400 relative to the nominal 240 degrees from the phase of the voltage at reference point 200. As will be explained below, the voltage at reference point 400 will be the input to the Phase C circuit shown schematically in FIG. 5c.

Figure 5A:
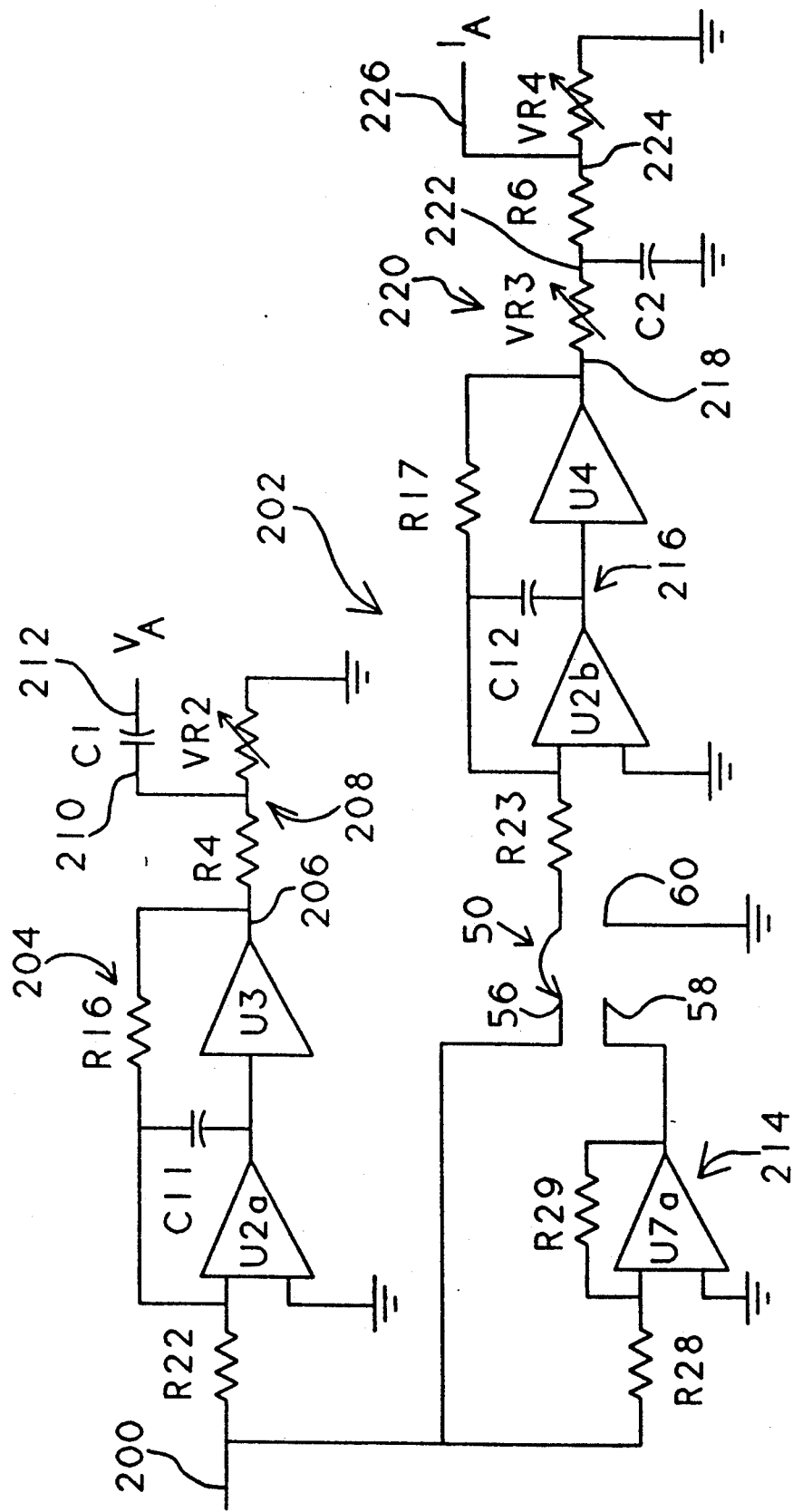
FIG. 5a is a schematic diagram illustrating one of the three circuits used by the present invention to generate phase voltage, phase current, and a phase angle between the phase voltage and phase current for one of the three phases emulated by the present invention.

Referring now to FIG. 5a, a schematic diagram illustrating the Phase A circuit 202, which is one of the three phase specific circuits used in the present invention, is shown. As will be shown, there is a phase specific circuit for each of Phase A, Phase B, and Phase C. These phase specific circuits include means for emulating specific parameters relating to the voltage and current within each of the sets of voltage and current referred to herein as Phases A, B and C. The Phase A circuit 202 takes, as its input, the voltage which was on line 200 and, using the inverting power buffer 204 comprised of resistors R22 (150K) and R16 (300K), capacitor C11 (100 pF), operational amplifier U2a, and power buffer U3. The output of the inverting power buffer 204 on line 206 is passed through an adjustable voltage divider 208 comprised of resistor R4 (2.7K) and variable resistor VR2 (0–1K) to obtain an adjustable voltage output on line 210 which is coupled through capacitor C1 (470 microfarads) to obtain $V_A$ on line 212. The magnitude of $V_A$ is controlled by adjusting the value of variable resistor VR2 which is controlled by knob 30. In the preferred embodiment of the invention, $V_A$ is connected to the Phase A voltage sensor in meter 20 through output cable 18.

With continued reference to FIG. 5a, the voltage on line 200 is coupled directly to banana jack 56. Alternatively, the voltage on line 200 is coupled to banana jack 58 through an inverter 214 comprised of resistor R28 (150K), resistor R29 (150K), and operational amplifier U7a. Consequently, different current transformer (CT) conditions on Phase A can be simulated simply by moving the plug at the end of the jumper wire connected to jack 50 from jack 56 (correct CT hook-up) to jack 58 (reversed leads on CT hook-up) or jack 60 (CT shorted).

The voltage on the jumper wire connected to jack 50 is coupled through an inverting power buffer 216 comprised of resistors R23 (150K) and R17 (330K), capacitor C12 (100 pF), operational amplifier U2b, and power buffer U4. The output of inverting power buffer 216, on line 218 is passed through a phase shifter 220 comprised of variable resistor VR3 (0–500 ohms) and capacitor C2 (15 microfarads) to obtain an output on line 222 whose phase depends upon the value of VR3. The value of VR3 is controlled by knob 40 which controls the relationship between the voltage and current phase angles on Phase A.

Finally, a voltage divider 224, comprised of resistor R6 (1K) and variable resistor VR4 (0–1K) is used to set the magnitude of the voltage, $I_A$ on line 226 by using knob 28. In the preferred embodiment of the invention, $I_A$ is connected to the Phase A current sensor in meter 20 through output cable 18.

Figure 5B:
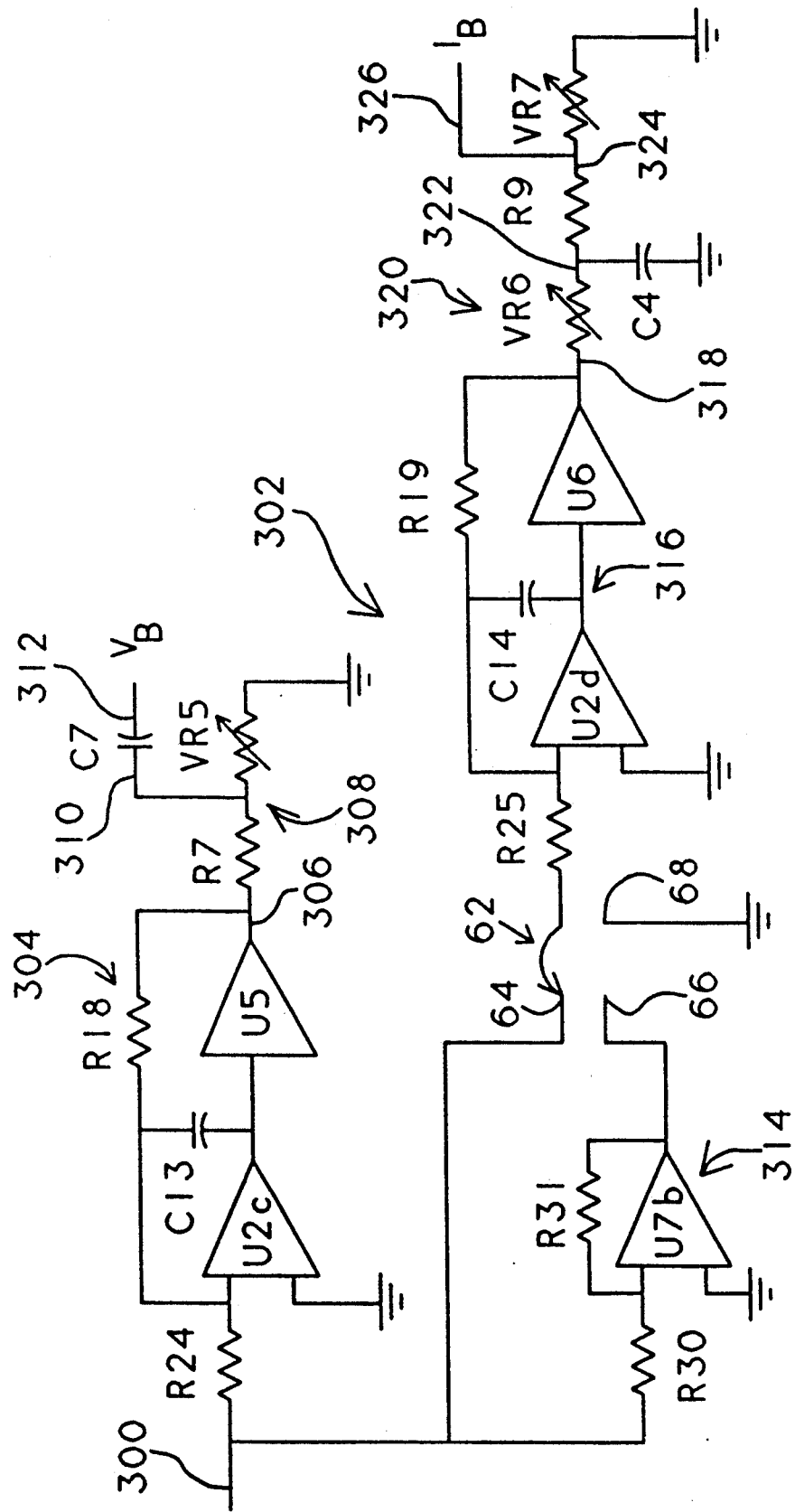
FIG. 5b is a schematic diagram illustrating the second of the three circuits used by the present invention to generate phase voltage, phase current, and a phase angle between the phase voltage and phase current for one of the three phases emulated by the present invention.

Referring now to FIG. 5b, a schematic diagram illustrating the Phase B circuit 302, which is the second of the three phase specific circuits used in the present invention, is shown. The Phase B circuit 302 takes, as its input, the voltage which was on line 300 and, using the inverting power buffer 304 comprised of resistors R24 (150K), and R18 (300K), capacitor C13 (100 pF), operational amplifier U2c, and power buffer U5. The output of the inverting power buffer 304 on line 306 is passed through an adjustable voltage divider 308 comprised of resistor R7 (2.7K) and variable resistor VR5 (0–1K) to obtain an adjustable voltage output on line 310 which is coupled through capacitor C7 (470 microfarads) to obtain $V_B$ on line 312. The magnitude of $V_B$ is controlled by adjusting the value of variable resistor VR5 which is controlled by knob 34. In the preferred embodiment of the invention, $V_B$ is connected to the Phase B voltage sensor in meter 20 through output cable 18.

With continued reference to FIG. 5b, the voltage on line 300 is coupled directly to banana jack 64. Alternatively, the voltage on line 300 is coupled to banana jack 66 through an inverter 314 comprised of resistor R30 (150K), resistor R31 (150K), and operational amplifier U7b. Consequently, different current transformer (CT) conditions on Phase B can be simulated simply by moving the plug at the end of the jumper wire connected to jack 62 from jack 64 (correct CT hook-up) to jack 66 (reversed leads on CT hook-up) or jack 68 (CT shorted).

The voltage on the jumper wire connected to jack 62 is coupled through an inverting power buffer 316 comprised of resistors R25 (150K) and R19 (360K), capacitor C14 (100 pF), operational amplifier U2d, and power buffer U6. The output of inverting power buffer 316, on line 318 is passed through a phase shifter 320 comprised of variable resistor VR6 (0–500 ohms) and capacitor C4 (15 microfarads) to obtain an output on line 322 whose phase depends upon the value of VR6. The value of VR6 is controlled by knob 42 which controls the relationship between the voltage and current phase angles on Phase B.

Finally, a voltage divider 324, comprised of resistor R9 (1K) and variable resistor VR7 (0–1K) is used to set the magnitude of the voltage, $I_B$ on line 326 by using knob 32. In the preferred embodiment of the invention, $I_B$ is connected to the Phase B current sensor in meter 20 through output cable 18.

Figure 5C:
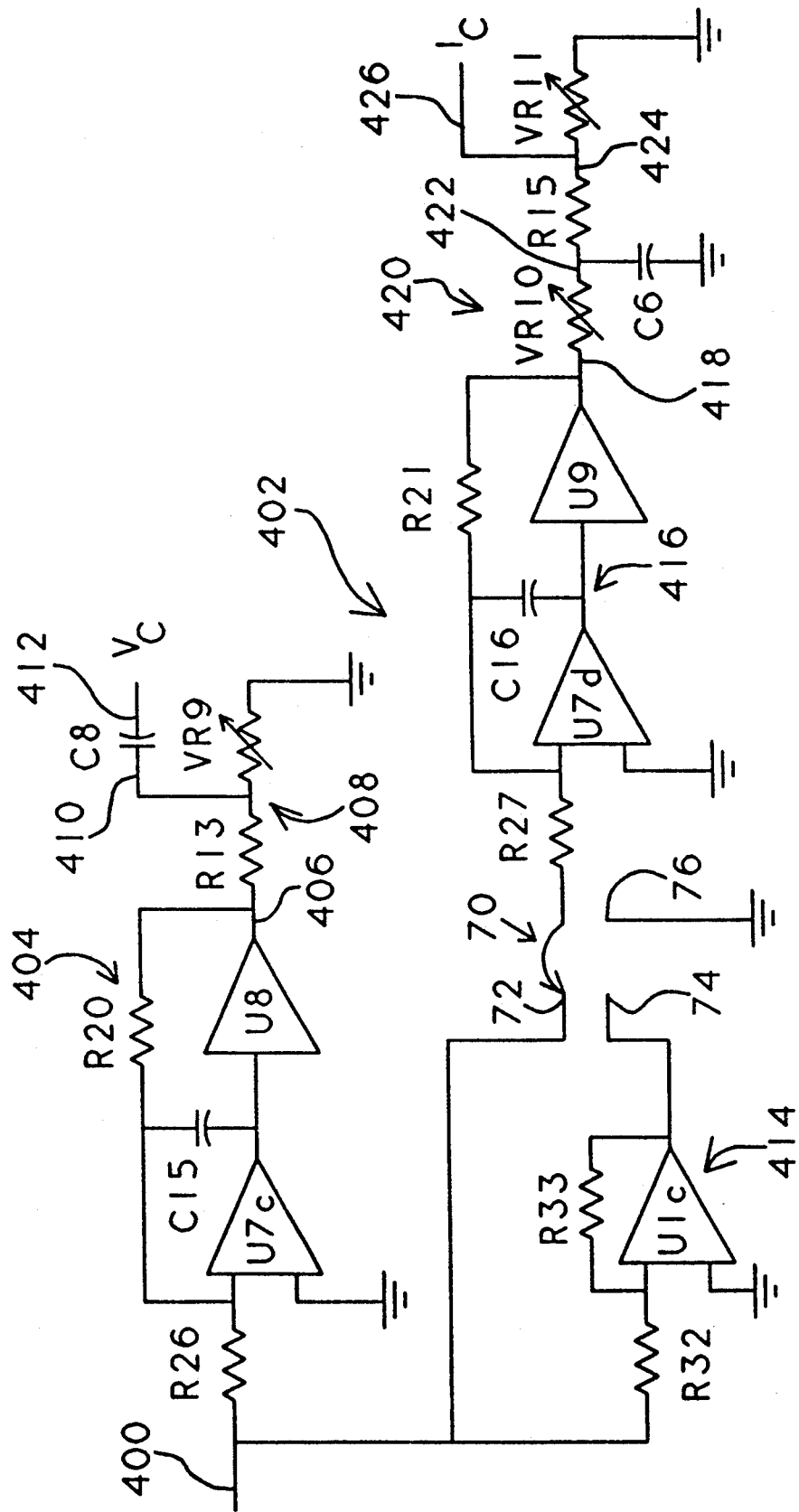
FIG. 5c is a schematic diagram illustrating the third of the three circuits used by the present invention to generate phase voltage, phase current, and a phase angle between the phase voltage and phase current for one of the three phases emulated by the present invention.

Referring now to FIG. 5c, a schematic diagram illustrating the Phase C circuit 402, which is the last of the three phase specific circuits used in the present invention, is shown. The Phase C circuit 402 takes, as its input, the voltage which was on line 400 and, using the inverting power buffer 404 comprised of resistors R26 (150K) and R20 (300K), capacitor C15 (100 pF), operational amplifier U7c, and power buffer U8. The output of the inverting power buffer 404 on line 406 is passed through an adjustable voltage divider 408 comprised of resistor R13 (2.4K) and variable resistor VR9 (0-1K) to obtain an adjustable voltage output on line 410 which is coupled through capacitor C8 (470 microfarads) to obtain $V_C$ on line 412. The magnitude of $V_C$ is controlled by adjusting the value of variable resistor VR9 which is controlled by knob 38. In the preferred embodiment of the invention, $V_C$ is connected to the Phase C voltage sensor in meter 20 through output cable 18.

With continued reference to FIG. 5c, the voltage on line 400 is coupled directly to banana jack 72. Alternatively, the voltage on line 400 is coupled to banana jack 74 through an inverter 414 comprised of resistor R32 (150K), resistor R33 (150K), and operational amplifier U1c. Consequently, different current transformer (CT) conditions on Phase C can be simulated simply by moving the plug at the end of the jumper wire connected to jack 70 from jack 72 (correct CT hook-up) to jack 74 (reversed leads on CT hook-up) or jack 76 (CT shorted).

The voltage on the jumper wire connected to jack 70 is coupled through an inverting power buffer 416 comprised of resistors R27 (150K) and R21 (360K), capacitor C16 (100 pF), operational amplifier U7d, and power buffer U9. The output of inverting power buffer 416, on line 418 is passed through a phase shifter 420 comprised of variable resistor VR10 (0-500 ohms) and capacitor C6 (15 microfarads) to obtain an output on line 422 whose phase depends upon the value of VR10. The value of VR10 is controlled by knob 44 which controls the relationship between the voltage and current phase angles on Phase C.

Finally, a voltage divider 424, comprised of resistor R15 (1K) and variable resistor VR11 (0-1K) is used to set the magnitude of the voltage, $I_C$ on line 426 by using knob 36. In the preferred embodiment of the invention, $I_C$ is connected to the Phase C current sensor in meter 20 through output cable 18.

The operational amplifiers used in the preferred embodiment of the invention are from a standard quad operational amplifier integrated circuit, i.e., part number TL074N, and the power buffer used in the preferred embodiment of the invention is a standard LT1010CN8 integrated circuit.

As has been illustrated, the voltages and currents which the emulator 10 sends to meter 20 through output cable 18 can be readily adjusted by using the controls on the emulator 10. While it has not been stated previously, it will be obvious to those skilled in the art that the voltages sent to the meter 20 by the emulator 10 must be connected directly to the sensors within the meter 20, rather than to the standard connection lugs on the meter 20, because the voltage levels provided by the emulator 10 are quite small relative to those to which the meter 20 would be subjected in an actual use environment. One skilled in the art could readily modify the emulator 10 to step up the output voltage levels to those more typical of actual operation, if that was desired, i.e., if it was desired to produce a modified version of the emulator 10 for use with different meters.

We claim:

1. A polyphase emulator for use in demonstrating the functionality of a polyphase electricity meter and for operation on a single phase electricity circuit comprising:

a. phase generating circuit means for generating multiple sets of currents and voltages, each of said sets having a nominal predetermined phase relationship with respect to each of the other sets, said phase generating circuit means including means for altering said nominal predetermined phase relationships between said sets of currents and voltages; and b. a plurality of phase specific circuit means, the number of said phase specific circuit means corresponding to the number of sets of currents and voltages generated by said phase generating circuit means, each of said plurality of phase specific circuit means including means for emulating specific parameters which relate to the phase relationships between the voltage and current within each of said sets as they relate to each other and to the voltage and currents within other ones of said sets.

2. The polyphase emulator of claim 1 wherein said phase generating circuit means produces three sets of currents and voltages.

3. The polyphase emulator of claim 2 wherein the second of said three sets of currents and voltages is nominally 120 degrees out of phase with respect to the first of said three sets of currents and voltages, and the third of said three sets of currents and voltages is nominally 240 degrees out of phase from the first of said three sets of currents and voltages.

4. The polyphase emulator of claim 3 wherein there are three phase specific circuit means corresponding to the number of sets of currents and voltages generated by said phase generating circuit means, each of said plurality of phase specific circuit means including means for emulating specific parameters relating to the voltage and current within each of said sets.

* * * * *